United States Patent [19]

Beil et al.

[11] Patent Number: 4,693,780
[45] Date of Patent: Sep. 15, 1987

[54] ELECTRICAL ISOLATION AND LEVELING OF PATTERNED SURFACES

[75] Inventors: Gerhard Beil, Erding; Alfred Pichler, Gernlinden; Horst Pachonik, Taufkirchen; Kurt Plehnert, Pullach, all of Fed. Rep. of Germany

[73] Assignee: Siemens Aktiengesellschaft, Berlin and Munich, Fed. Rep. of Germany

[21] Appl. No.: 808,144

[22] Filed: Dec. 12, 1986

[30] Foreign Application Priority Data

Feb. 22, 1985 [DE] Fed. Rep. of Germany ....... 3506356

[51] Int. Cl.[4] .......................................... H01L 21/312
[52] U.S. Cl. ..................................................... 156/643
[58] Field of Search ................... 427/96; 430/314, 315, 430/319; 29/846; 156/661.1; 357/54; 156/643, 668, 659.1

[56] References Cited

U.S. PATENT DOCUMENTS

| | | | |
|---|---|---|---|
| 3,373,323 | 3/1968 | Wolfrum et al. | 357/14 |
| 3,669,733 | 6/1972 | Allington | 117/212 |
| 3,700,497 | 10/1972 | Epifano et al. | 117/212 |
| 4,039,371 | 8/1977 | Brunner et al. | 357/54 |
| 4,040,083 | 8/1977 | Saiki et al. | 357/54 |
| 4,244,799 | 1/1981 | Fraser et al. | 156/659.1 |
| 4,305,974 | 12/1981 | Abe et al. | 427/96 |
| 4,328,262 | 5/1982 | Kurahashi et al. | 427/93 |
| 4,434,224 | 2/1984 | Yoshikawa | 156/659.1 |
| 4,523,975 | 6/1985 | Groves et al. | 357/54 |
| 4,579,624 | 4/1986 | Majima | 156/668 |
| 4,613,404 | 9/1986 | Tabei | 156/659.1 |

FOREIGN PATENT DOCUMENTS

| | | |
|---|---|---|
| 0026967 | 4/1981 | European Pat. Off. . |
| 0122631 | 10/1984 | European Pat. Off. . |
| 25224 | 8/1979 | Japan ................... 29/846 |
| 158183 | 12/1979 | Japan ................... 430/314 |

OTHER PUBLICATIONS

IBM Technical Disclosure Bulletin, vol. 27, No. 2, Jul. 1984, by J. P. Kent, pp. 1147–1150.
IBM Technical Disclosure Bulletin, vol. 13, No. 6, Nov. 1970, by S. A. Abbas et al, p. 1567.

Primary Examiner—Lowell A. Larson
Attorney, Agent, or Firm—John Francis Moran

[57] ABSTRACT

In the fabrication of micro-electronic circuits, it is often necessary to arrange a number of patterned surfaces be well insulated from each other. At the same time, however, the pattern edges of the layer to be overlaid must present a defined slope angle of between the range of forty to sixty degrees, for example. The invention solves this problem through a two stage coating process in which a polymer is first applied which coats the edges and is then coated with a photoresist having good leveling properties.

3 Claims, 11 Drawing Figures

FIG 1
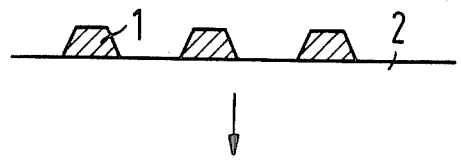
FIG 2
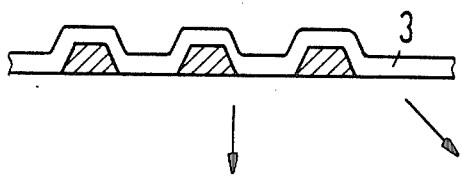
FIG 2a
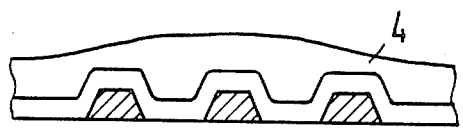
FIG 3
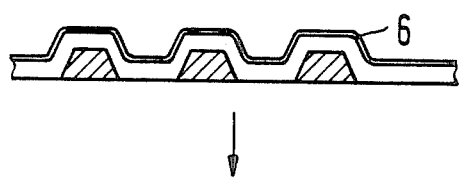
FIG 2b
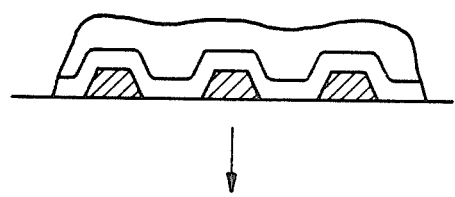
FIG 4
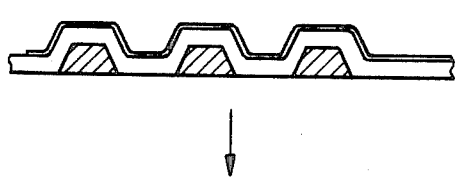
FIG 2c
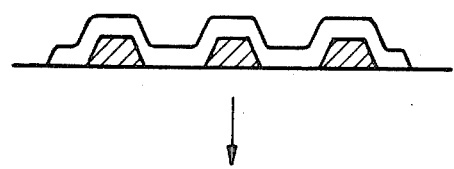
FIG 5
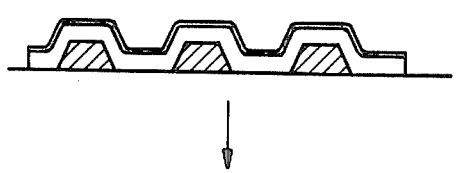
FIG 6

ELECTRICAL ISOLATION AND LEVELING OF PATTERNED SURFACES

BACKGROUND OF THE INVENTION

This invention relates to a process for producing patterned surfaces, and, more particularly, it relates to a process for electrically insulating and leveling patterned, preferably conducting surfaces.

It is often necessary, in micro-electronic circuits, to arrange a flat number of patterned surfaces, one above the other. This requires that the individual structures be well insulated from each other. Each insulating layer before the patterned conductors are applied should be relatively flat. At the same time sharp edges must be avoided on the lower layers of patterns.

It has been common practice to use a photoresistive material for this purpose in the past. This practice has the disadvantage, however, that the sides or edges of the conductors are not adequately covered. Good covering of the steps or transitions produced by the height of the conductive elements in the lower lying patterns is essential to providing the necessary insulating properties. A high degree of leveling of the patterned irregularities for a given layer thickness must be attained. (>90% degree of smoothness).

SUMMARY OF THE INVENTION

An objective of the invention is to provide a process or method concept for the above mentioned application through which leveling with the desired edge angles and good separation of the various patterned surfaces is concurrently obtained. The layer to be added must thereby produce a definite slope angle at the pattern edges and, in addition, a very smooth pattern edge and surface.

This problem is solved by coating the patterned, preferably conducting surfaces, with an organic polymer, a polyimide for example, and a photoresist. The organic polymer used for coating must:

(a) be stable over a specific temperature range,
(b) be stable under high vacuum,
(c) have good insulating properties, and
(d) capable of being patterned by means of photolithographic and etching techniques with organic as well as inorganic etching masks.

Good step coating with concurrent smoothing is attained with the application of the inventive principles. The inventive method provides a step-by-step development for producing multilayered patterns, one above the others, which are electrically isolated from one another.

BRIEF DESCRIPTION OF THE DRAWING

Features of the invention and additional objects of the invention will be more readily appreciated and better understood by reference to the following detailed description which should be considered in conjunction with the drawing.

FIG. 1 illustrates a surface with patterned strip conductors.

FIG. 2 shows patterned strip conductors insulated from each other using a polyimide.

FIG. 2a is a view as in FIG. 2 with the addition of photoresist.

FIG. 2b depicts an intermediate step used on the surface of FIG. 2

FIG. 2c illustrates a patterned polyimide after the removal of the photoresist mask.

FIG. 3 demonstrates the addition of an inorganic etching mask.

FIG. 4 depicts a patterned inorganic etching mask.

FIG. 5 shows patterning of polyimide by means of inorganic etching mask and dry etching.

DETAILED DESCRIPTION

In FIG. 1, a circuit pattern 1 of a conductive material on a substrate 2 is shown in cross sectional view. A typical suitable material for substrate 2 is silicon dioxide ($SiO_2$). This circuit pattern may, for example, comprise coils and conducting leads. As may be seen from FIG. 2, insulation material such as an unpolymerized polyimide 3, is applied over this circuit. Following this step there are two possibilities. The first alternative is shown in FIGS. 2a through 2c. The other alternative is demonstrated in FIGS. 3 through 5.

Figure 6:
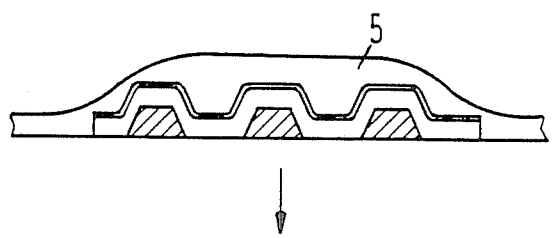
FIG. 6 illustrates the leveling of the conductor strip pattern with photoresist.
Figure 8:
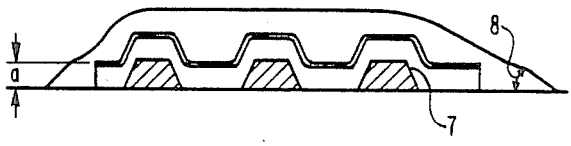
FIG. 8 demonstrates the baking of the photoresist.

As shown in FIG. 2a, the circuit of FIG. 2 is coated with photoresist 4. A conventional positive photoresist suitable for these purposes is known to those skilled in the art as Hunt HPR 206. Illumination or exposure follows with a requisite mask. The photoresist and polyimide are then removed from the illuminated areas defined by the mask with a suitable solvent. The result of this condition is shown in FIG. 2b. Next, another solvent which does not act upon the unpolymerized polyimide is employed to remove the photoresist. During the next processing step, the polyimide is converted by temperature treatment into an insoluble polymerized state. The photoresist is thereupon again applied as indicated in FIG. 6. The photoresist levels or smooths out the remaining pattern irregularities to the required degree. The formation of the photoresist is such in relation to the previously formed polyimide edge that the polyimide edge is covered to a specific degree with photoresist. Through a following baking step (FIG. 8) the photoresist is converted to a stable polymer state. During this baking procedure the photoresist flows in a controlled manner independent among other things of the thickness of the resist
   pattern build-up (designated as dimension a in FIG. 8)
   separation of the polyimide edge from the photoresist edge.

This results in a completely well defined slope edge angle 8. A suitable range of the slope edge angle is between forty and sixty degrees. In addition, the transitions between edges, such as outer edge or sidewall 7, and surfaces of the pattern are very smooth due to the flow of the photoresist.

In proceeding with the second previously mentioned alternative, the unpolymerized polyimide step shown in FIG. 2 is transformed into the polymerized state by suitable temperature processing such as by heat (cycling). The polyimide provides outstanding temperature and high vacuum stability along with high insulating efficiency. Coating of the pattern steps is therefore very good.

Figure 7:
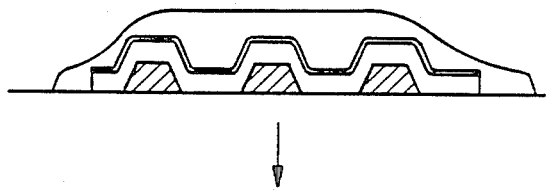
FIG. 7 depicts the forming of a pattern in the photoresist.

As shown in FIG. 3, an inorganic etching mask 6, of $SiO_2$ (silicon dioxide) for example, is applied to the pattern surface depicted in FIG. 2. After the application of photoresist, its illumination and pattern formation as well as the etching of the inorganic mask, the photoresist is again removed (FIG. 4). A dry etching process follows the patterning the polyimide as shown in FIG. 5. The method then continues with the steps shown in the previously described FIGS. 6 through 8.

Pattern formability of polyimide is possible either in the unpolymerized state by means of an organic etching mask (FIGS. 2a through 2c) and suitable etching solutions or in the polymerized condition by means of an inorganic etching mask (FIGS. 3 through 4) followed by dry etching.

In accordance with the inventive method the desired characteristics of photoresist and polyimide are combined to satisfy the established requirements.

We claim:

1. A method for electrically isolating and leveling at least one exposed surface of a substrate having patterned conductive elements thereon for providing at least one additional surface thereon, the method comprising the steps of: first covering the one exposed surface with an organic polymer of polyimide, second covering and leveling the polyimide with a photoresist to insulate and provide a substantially level surface over the conductive elements over the central region of the substrate substantially coextensive with an area occupied by the patterned conductive elements while further tapering off to provide a tapered portion having a predetermined angle between it and the substrate surface at its edge, forming a second surface of patterned conductive elements on the leveled surface and repeating said first and second steps thereon, the step of first covering comprises applying an unpolymerized polyimide to the entire substrate surface; and the step of second covering comprises covering completely with photoresist, illuminating and patterning the photoresist and the polyimide and removing the photoresist and the polyimide polymerized and the surface again being entirely covered with photoresist, patterned and baked.

2. A method for electrically isolating and leveling at least one exposed surface of a substrate having patterned conductive elements thereon for providing at least one additional surface thereon, the method comprising the steps of: first covering the one exposed surface with an organic polymer of polyimide, second covering and leveling the polyimide with a photoresist to insulate and provide a substantially level surface over the conductive elements over the central region of the substrate substantially coextensive with an area occupied by the patterned conductive elements while further tapering off to provide a tapered portion having a predetermined angle between it and the substrate surface at its edge, forming a second surface of patterned conductive elements on the leveled surface and repeating said first and second steps thereon, the step of first covering comprises applying unpolymerized polyimide to the entire substrate surface and baking, using an inorganic etching mask applied to the entire surface and after patterning of this etching mask the polyimide is patterned through a dry etching process, and the step of second covering comprises applying photoresist to the entire surface, patterned and baked.

3. A method for electrically isolating and leveling at least one exposed surface of a substrate having patterned conductive elements thereon for providing at least one additional surface thereon, the method comprising the steps of: first covering the one exposed surface of the substrate with an insulative material comprising an organic polymer of polyimide, and second covering and leveling the polyimide with another insulative material comprising a photoresist to form a substantially planar region over an area containing the patterned conductive elements and a tapering off portion between the planar region and edges of the substrate to form a predetermined slope angle between the tapering off portion and the substrate having a range of forty to sixty degrees.

* * * * *

UNITED STATES PATENT AND TRADEMARK OFFICE
CERTIFICATE OF CORRECTION

PATENT NO. : 4,693,780
DATED : September 15, 1987
INVENTOR(S) : Beil et al.

It is certified that error appears in the above—identified patent and that said Letters Patent is hereby corrected as shown below:

Line 22, Title page, filing date should read --December 12, 1985-- instead of "December 12, 1986".

Signed and Sealed this

Ninth Day of February, 1988

Attest:

DONALD J. QUIGG

Attesting Officer

Commissioner of Patents and Trademarks